SPUTTER ETCH MASK

Filed Dec. 3, 1969

INVENTOR.
Lewis E. Terry
BY
Mueller, Aichele & Rauner
ATTORNEYS

United States Patent Office 3,649,503
Patented Mar. 14, 1972

3,649,503
SPUTTER ETCH MASK

Lewis E. Terry, Phoenix, Ariz., assignor to Motorola, Inc., Franklin Park, Ill.

Filed Dec. 3, 1969, Ser. No. 881,715
Int. Cl. C23c *15/00*
U.S. Cl. 204—192 2 Claims

ABSTRACT OF THE DISCLOSURE

A metal film, such as titanium which chemically etches relatively easily but sputter etches relatively slowly, serves as a mask in a sputter etching process for metals such as gold and platinum which are difficult to etch chemically.

BACKGROUND OF THE INVENTION

Figure 1:
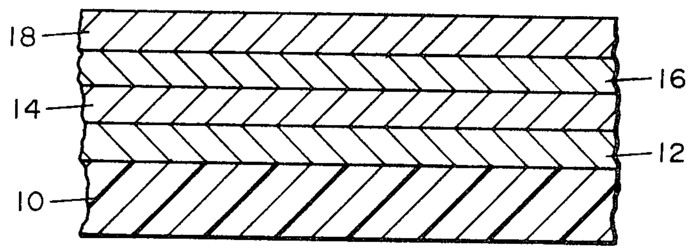

This invention relates to etching masks and more particularly to a mask suitable for use in a sputter etching process.

Overlay metallization systems having two or three metal layers or films have become a standard practice in the fabrication of a wide variety of semiconductor devices. These mult-layer metallization systems consist of a first metal layer deposited on the semiconductor which is capable of forming a particularly good ohmic contact with the semiconductor and capable of adhering to the passification layer without interaction, followed by the deposition of one or more additional layers of metal to provide the best possible surface for lead attachment. Common examples of such plural layer systems include molybdenum - gold, aluminum - molybdenum - gold, aluminum-nickel, aluminum-michrome, chromium-gold, as well as platinum comprising systems such as titanium-platinum-gold, chromium-platinum-gold, and titanium-platinum. The delineation of platinum and gold films has proved difficult, however, because of the resistance of these metals to chemical etching and because of the inherent limitations of the usual photoresist masking compositions which are used for selective etching techniques. Masks formed of a typical photoresist composition such as KMER are unsatisfactory as masks for use in sputter etching due to the difficulty of removing the photoresist material when it is sufficiently thick as well as the problem of the photoresist material coming off too soon during sputtering if the photoresist layer is thin. Since metals such as platinum and gold are difficult to etch chemically, attempts to etch these by sputtering have been attempted. Sputter etching of these metals has not been satisfactory, however, due to the problems encountered with the mask composition. Typical photoresist compositions are entirely unsatisfactory as masks for sputter etching due to the difficulty in removing these mask materials when the mask thickness is adequate and the difficulty in keeping the mask material on the metal if the mask thickness is not adequate.

THE INVENTION

It is an object of this invention to provide an improved method of sputter etching metal films. It is another object of this invention to provide an improved mask for sputter etching processes.

These and other objects are accomplished in accordance with this invention by the use of a mask of a thin metal film such as titanium which chemically etches relatively easily and sputter etches relatively slowly compared to gold and platinum. A layer or film of titanium is placed over the platinum and/or gold layers or the like which are to be etched by sputtering. The desired mask for sputter etching the platinum and/or gold is formed by chemically etching the titanium. The unetched titanium metal then serves as a mask during the sputter etching of the platinum and/or gold layers. Titanium sputter etches at a slow rate compared with the platinum and/or gold. As a result, the platinum and gold layers are completely etched away in the regions desired before the titanium mask is removed by sputtering. The titanium mask is then easily removed by a chemical etching step which leaves the platinum and/or gold unaffected.

Other objects of this invention will be apparent from the following detailed description, reference being made to the accompanying drawings wherein various stages of the etching process are shown.

IN THE DRAWINGS

FIGS. 1 through 4 are cross-sectional views of the micro-electronic semiconductor structure illustrating various stages in the process of the invention.

DESCRIPTION OF THE ILLUSTRATIVE EMBODIMENT

As shown in FIG. 1, the substrate 10 has a layer of metal 12 thereon. The substrate 10 is a semiconductor such as silicon or germanium, a ceramic such as alumina, beryllia, steatite, etc., glass, a metal such as iron, nickel, molybdenum, copper, aluminum, etc., or a plastic such as Teflon, nylon, epoxy resin, etc. Other semiconductors which may be used include, for example, gallium arsenide and other III–IV compound semiconductors. Metal layer or film 12 is preferably titanium or chromium which form a particularly good ohmic contact with the semiconductor and adhere tightly to the semiconductor substrate without interaction therewith. Other metals which may be used for the layer 12 include chromium, tantalum, molybdenum, tungsten, nickel, zirconium, hafnium, niobium, iron, copper, and the like. The metal layer 12 has a thickness of between 500 to 2500 angstroms with a preferred thickness of about 1000 angstroms. The layer 12 is formed by known methods, such as vacuum evaporation or sputtering.

On top of the metal layer 12 is a metal layer or film 14. Metal layer 14 is a metal which is an excellent conductor and one which provides a suitable base for the attachment and leads. Metal layer 14 is preferably platinum, gold, palladium, rhodium, iridium, and the like. The thickness of layer 14 is about 500 to 5000 angstroms and preferably 1000 to 2000 angstroms. Layer 14 is deposited by vacuum evaporation or sputtering. On top of the metal layer 14 is a metal layer or film 16. Metal layer 16 is optional and is of a metal having properties similar to layer 14. The thickness of layer 16 is the same as layer 14. Layers 14 and 16 are metals which are difficult to etch chemically and which will sputter etch relatively quickly.

In accordance with this invention, a metal layer or film 18 is of a metal such as titanium which chemically etches relatively fast and which is relatively resistant to sputter etching compared to gold and platinum. Other metals suitable for use in this layer are chromium, zirconium, tantalum, tungsten, niobium, molybdenum, and hafnium. The thickness of this layer is about 500 to 2500 angstroms and is provided by known methods such as vacuum evaporation and sputtering.

Figure 2:
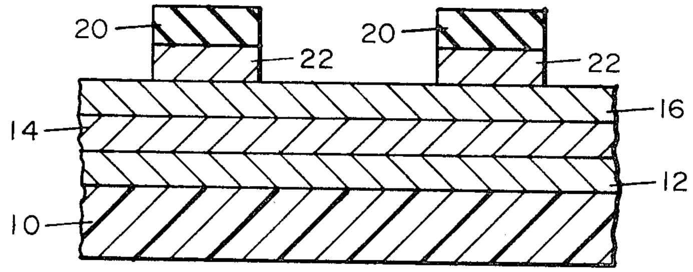

As shown in FIG. 2, a photoresist mask or layer 20 of a material KMER is used in the conventional manner as shown in FIG. 2 to chemically etch layer 18 to form the metal mask or region 22. Since metal layer 18 is relatively thin and since metals selected for layer 18 are relatively easy to etch, excellent definition is obtained by using the photoresist mask and the chemical etching step. The layer 20 of KMER is then removed from the metal mask 22.

Figure 3:
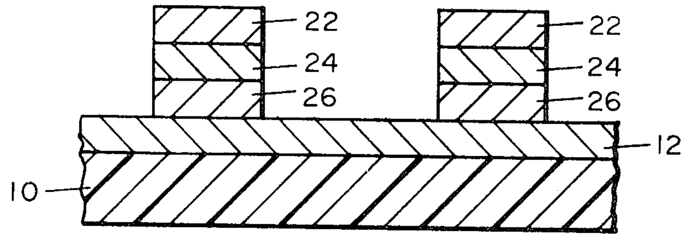

Layers 14 and 16 are etched by sputtering to form the desired metal regions 24 and 26 as shown in FIG. 3. In accordance with this invention, the metal region 22 serves as a mask during the sputtering step. As indicated previously, the metal in the mask 22 is selected so that the rate of sputter etching of this region is substantially less than the metals in layers 14 and 16 in order to provide a protective layer for the regions 24 and 26 immediately below the region 22. Layer 12 is usually a metal similar to region 22 having a relatively slow sputter etch rate and is relatively unetched compared with layers 24 and 26.

Figure 4:
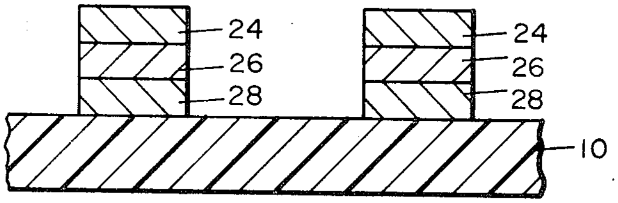

As shown in FIG. 4, the mask layer 22 is removed by chemically etching. Regions 24 and 26 serve as a mask to permit the chemical etching of the metal layer 12 to form the region 28 immediately below the region 26, thereby providing the resultant metallization system. In a preferred embodiment of this invention, the substrate 10 is a silicon wafer or a ceramic, region 28 is titanium, region 26 is platinum, and region 24 is gold.

Example

A silicon wafer is etched, lapped, and polished to provide a suitable surface. A titanium layer about 2000 angstroms thick is deposited on top of the silicon substrate. A layer of platinum having a thickness of 2000 angstroms is deposited on top of the titanium. A layer of gold about 5000 angstroms thick is deposited on top of the platinum layer.

On top of the gold layer is deposited a titanium layer about 2000 angstroms thick. A KMER photoresist mask is formed on the titanium layer and the unwanted titanium is etched away with an $H_2SO_4$:HF solution. The KMER layer is removed. The gold and platinum underneath the remaining portion of the upper titanium layer is etched by sputtering. The titanium serves as a mask since it is etched to a relatively small degree compared with the gold and the platinum. The titanium mask region and the titanium layer which was exposed by the removal of the gold and platinum layers are then removed by a chemical etching step using an $H_2SO_4$:HF mixture as an etchant. This process yielded the desired metallization system in which the silicon substrate had a titanium-platinum-gold metallization system thereon.

I claim:

1. A method of sputter etching a metal film comprising the steps of:

providing a substrate taken from the group consisting of silicon, germanium and ceramic, depositing a first metal film which is taken from the group consisting of chromium, titanium, zirconium, tantalum, tungsten, molybdenum, niobium and hafnium and which is etched chemically at a relatively fast rate and is sputter etched at a relatively slow rate, depositing at least one second metal film taken from the group consisting of gold, platinum, palladium, rhodium, and iridium which is sputter etched at a relatively fast rate as is etched chemically at a relatively slow rate on said first metal film, depositing a third metal film taken from the group consisting of chromium, titanium, zirconium, tantalum, tungsten, molybdenum, niobium, and hafnium which is etched chemically at a relatively fast rate and is sputter etched at a relatively slow rate on said second metal film, applying a layer of photoresist on said third metal film, removing selected portions of said photoresist film to expose a portion of said third metal film, chemically etching said exposed portion of said third metal film to expose a portion of said second metal film, removing said photoresist layer, sputter etching said exposed portion of said second metal film to expose a portion of said first metal film, and chemically etching said exposed portions of said first and third metal films.

2. A method of sputter etching a metal film comprising the steps of:

providing a silicon substrate, depositing a first film of titanium on said silicon substrate, depositing a film of platinum on said first film of titanium, depositing a film of gold on said platinum film, depositing a second film of titanium on said gold film, applying a layer of photoresist on said second titanium film, removing selected portions of said photoresist layer to expose a portion of said second titanium film, chemically etching said exposed portion of said second titanium film to expose a portion of said gold film, sputter etching said exposed portion of said gold film and the portion of said platinum film directly underneath said exposed gold portion to expose a portion of said first titanium film, and chemically etching said exposed portion of said first and second titanium films.

References Cited

UNITED STATES PATENTS

| | | | |
|---|---|---|---|
| 3,410,774 | 11/1968 | Barson et al. | 204—192 |
| 3,271,286 | 9/1966 | Lepselter | 204—192 |
| 3,474,021 | 10/1969 | Davidse et al. | 204—192 |
| 3,479,269 | 11/1969 | Byrnes et al. | 204—192 |
| 3,516,914 | 6/1970 | Hall | 204—192 |
| 3,287,612 | 11/1966 | Lepselter | 317—235 |

JOHN H. MACK, Primary Examiner

S. S. KANTER, Assistant Examiner